United States Patent
Roy et al.

(10) Patent No.: US 9,318,501 B2
(45) Date of Patent: Apr. 19, 2016

(54) METHODS AND STRUCTURES FOR SPLIT GATE MEMORY CELL SCALING WITH MERGED CONTROL GATES

(71) Applicants: Anirban Roy, Austin, TX (US); Ko-Min Chang, Austin, TX (US)

(72) Inventors: Anirban Roy, Austin, TX (US); Ko-Min Chang, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/303,290

(22) Filed: Jun. 12, 2014

(65) Prior Publication Data
US 2015/0364478 A1    Dec. 17, 2015

(51) Int. Cl.
*H01L 27/115* (2006.01)
*H01L 21/28* (2006.01)
*H01L 29/423* (2006.01)
*H01L 29/66* (2006.01)

(52) U.S. Cl.
CPC ...... *H01L 27/1157* (2013.01); *H01L 21/28282* (2013.01); *H01L 29/42344* (2013.01); *H01L 29/66833* (2013.01)

(58) Field of Classification Search
CPC  B82Y 10/00; H01L 27/11521; H01L 27/115; H01L 21/28273
USPC ........................... 438/267; 257/288, E21.209
See application file for complete search history.

(56) References Cited

U.S. PATENT DOCUMENTS

| | | |
|---|---|---|
| 6,124,609 A | 9/2000 | Hsieh et al. |
| 6,949,791 B2 | 9/2005 | Abedifard |
| 2008/0076221 A1* | 3/2008 | Kang et al. ............ 438/267 |
| 2012/0135596 A1* | 5/2012 | Kang et al. ............ 438/594 |
| 2014/0264539 A1* | 9/2014 | Do et al. ................ 257/319 |

OTHER PUBLICATIONS

Chang, K., "SG-TFS: a Versatile Embedded Flash with Silicon Nanocrystals as the Storage Medium", 9th International Conference on Solid-State and Integrated-Circuit Technology, Oct. 2008, pp. 943-946.

Ma, Y. et al., "A Novel High Density Contactless Flash Memory Array Using Split-Gate Source-Side-Injection Cell for 5V-Only Applications", 1994 Symposium on VLSI Technology Digest of Technical Papers, pp. 49-50.

* cited by examiner

*Primary Examiner* — Evan Pert
*Assistant Examiner* — Changhyun Yi

(57) ABSTRACT

A memory device has first and second memory cells in and over a substrate. A first doped region is in a first active region. A top surface of the first active region is substantially coplanar with a top surface of the first doped region. A control gate is over the first doped region and extends over a first side of the first doped region and over a second side of the first doped region. A charge storage layer is between the first control gate and the first active region including between the first select gate and the first doped region. A first select gate is over the first active region on the first side of the first doped region and adjacent to the control gate. A second select gate is over the first active region on the second side of the first doped region and adjacent to the control gate.

11 Claims, 5 Drawing Sheets

METHODS AND STRUCTURES FOR SPLIT GATE MEMORY CELL SCALING WITH MERGED CONTROL GATES

BACKGROUND

1. Field

This disclosure relates generally to split-gate memory cells and methods for making split-gate memory cells, and more specifically, to methods and structures for split-gate memory cell scaling with merged control gates.

2. Related Art

In a typical split-gate nonvolatile memory cell, a control gate may be electrically common to a plurality of bitcells. However, the control gates may be physically separated from one another. However, forming a common control gate structure leads to difficulty in establishing contact with the active regions of the underlying substrate.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As the manufacturing processes for memory arrays scale smaller, there exists a greater need for the constituent components of the memory array to scale accordingly. One approach to scaling nonvolatile memory arrays has been to bury a source region used by the memory cells constituting the array, thus allowing for larger gate areas, improving contact areas, manufacturing processes, and/or performance parameters associated with the memory array.

In one aspect, a method of making a non-volatile memory ("NVM") structure achieves an increased gate contact area by burying a source region within an active region of the semiconductor substrate. In some embodiments, this may be done along some or all of the active region along a wordline, depending on the particular manufacturing configuration. The buried source region may then allow for a larger, shared control gate structure to be deposited over the source region such that multiple bitcells of an NVM array may share the larger control gate structure. This may be better understood by reference to the drawings and the following written description.

The semiconductor substrate described herein can be any semiconductor material or combinations of materials, such as gallium arsenide, silicon germanium, silicon-on-insulator (SOI), silicon, monocrystalline silicon, the like, and combinations of the above. Oxide layer refers to a silicon oxide layer unless otherwise noted. Similarly, nitride layer refers to a silicon nitride layer unless otherwise noted.

Memory arrays may store data through the use of a variety of charge storage techniques. In order to scale the size of the memory array, it may be necessary or desirable to likewise scale the components storing charge. One method of storing charge in a compact manner may be through the use of discreet, isolated charge storage areas as opposed to larger, more charge-diffuse methods. Such methods may be collectively referred to as "thin film storage" or "TFS." One example of such a thin film storage is the use of nanocrystals isolated from one another in a charge storage layers. Although the following figures and example make reference to the use of nanocrystals in one or more charge storage layer(s), other thin film storage techniques may be used without departing from the scope of the present disclosure. For example, nitride thin film storage techniques may be used.

Figure 1:
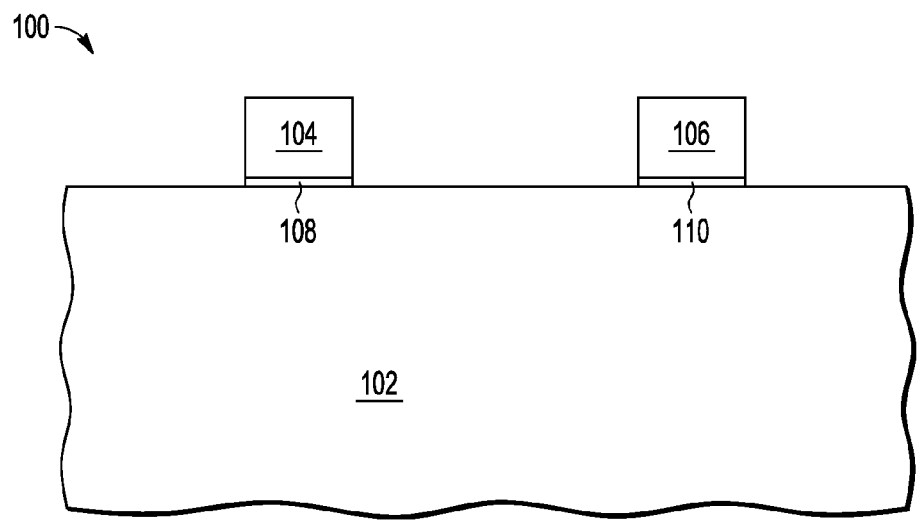
FIG. 1 illustrates an example cross-section of a semiconductor device at a step in a manufacturing process for implementing merged control gates, in accordance with certain aspects of the present disclosure.

FIG. 1 illustrates an example cross-section of semiconductor device 100 at a step in a manufacturing process for implementing merged control gates, in accordance with certain aspects of the present disclosure. In some embodiments, semiconductor device 100 may include a substrate 102 over which is formed a plurality of select gates 104, 106. Select gates 104, 106 may be separated from substrate 102 via one or more gate dielectric layers 108, 110, respectively.

Figure 2:
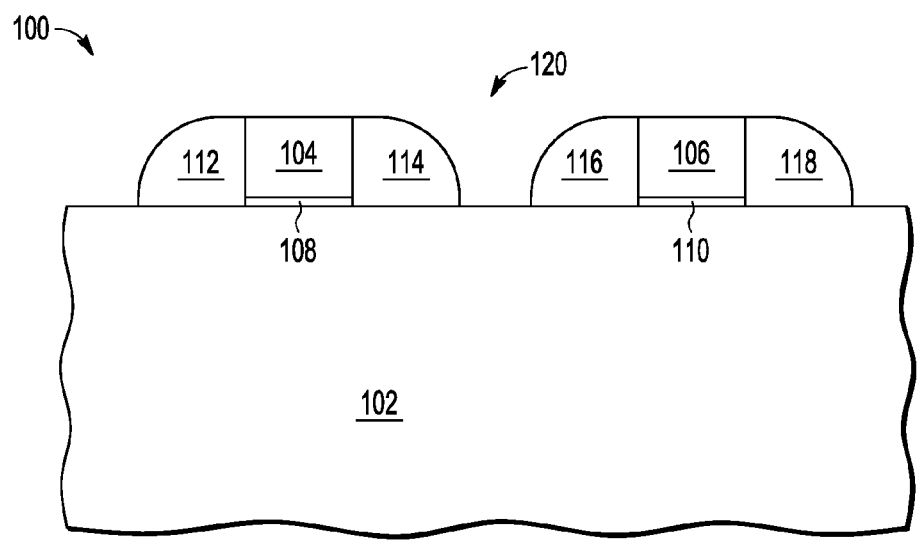
FIG. 2 illustrates the example cross-section of the semiconductor device after a plurality of sidewall spacers have been formed around the select gates, in accordance with certain embodiments of the present disclosure.

FIG. 2 illustrates the example cross-section of semiconductor device 100 after a plurality of sidewall spacers 112, 114, 116, 118 have been formed around select gates 104, 106, in accordance with certain embodiments of the present disclosure. For example, select gate 104 may have sidewall spacer 112 on a first side, and sidewall spacer 114 on a second side opposite the first side. The second side may be in the direction of another select gate such as select gate 106. Likewise, select gate 106 may have sidewall spacer 116 on a side in the direction of select gate 104 and sidewall spacer 118 on a side opposite that of sidewall spacer 116. Sidewall spacers 112, 114, 116, 118 may be formed by any appropriate process, including isotropic and/or anisotropic spacer processes, etching processes, etc. In some embodiments, opening 120 may be formed between the sidewall spacers formed between select gates 104, 106 (e.g., between sidewall spacers 114, 116).

Figure 3:
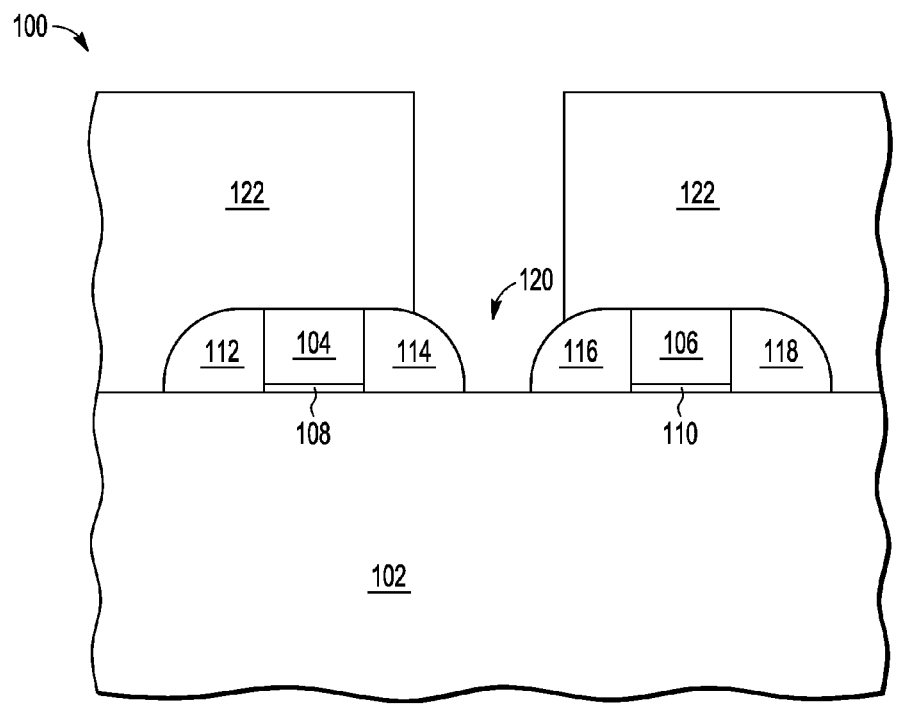
FIG. 3 illustrates the example cross-section of the semiconductor device after the placement of a patterned photoresist layer has been made over the select gates; substrate; and some or all of the sidewall spacers; in accordance with certain embodiments of the present disclosure.

FIG. 3 illustrates the example cross-section of semiconductor device 100 after the placement of a patterned photoresist layer 122 has been made over select gates 104, 106; substrate 102; and some or all of sidewall spacers 112, 114, 116, 118; in accordance with certain embodiments of the present disclosure. Photoresist layer 122 may be placed in such a way as to leave uncovered some or all of opening 120. As described in more detail below with reference to FIGS. 4-9, photoresist layer 122 may be formed in such a way as to guide the formation of source region 124 in a manner that is appropriately aligned with select gates 104, 106. For example, source region 124 may be formed such that a center of source region 124 is equidistant from select gates 104, 106.

Figure 4:
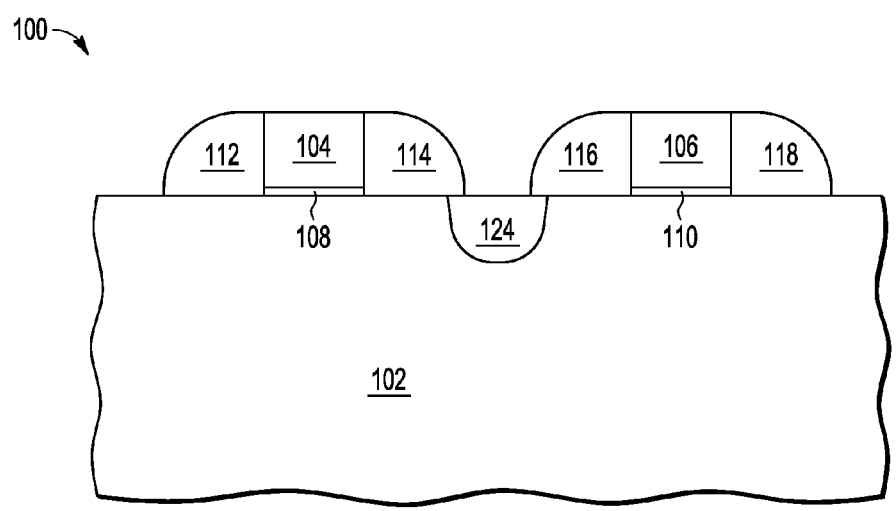
FIG. 4 illustrates the example cross-section of the semiconductor device after forming a source region and removing the photoresist layer, in accordance with certain embodiments of the present disclosure.

FIG. 4 illustrates the example cross-section of semiconductor device 100 after forming source region 124 and removal of photoresist layer 122, in accordance with certain embodiments of the present disclosure. Source region 124 may be doped via any appropriate doping process (e.g., in-situ doping) with an appropriate doping type (e.g., N-type, P-type). Source region 124 is formed in an active region of substrate 102 that has a particular doping of a concentration that is selected for the bitcells in the memory array.

Figure 5:
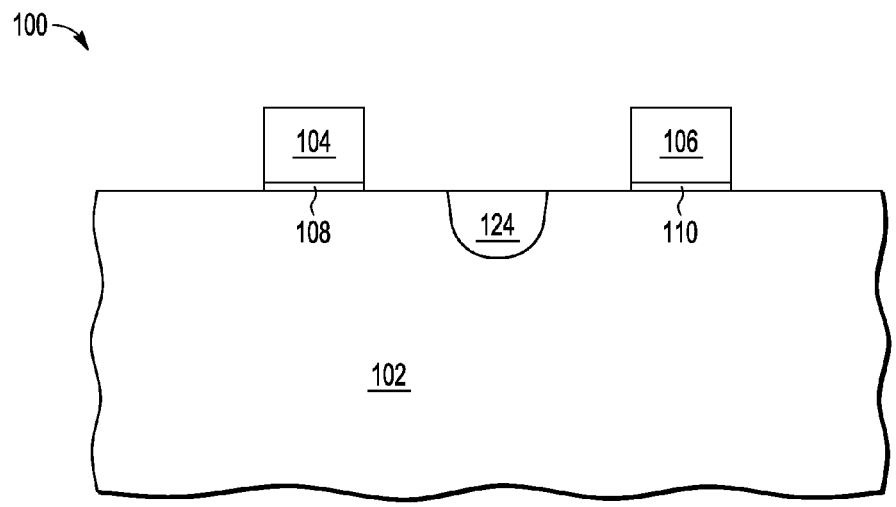
FIG. 5 illustrates the example cross-section of the semiconductor device after removing sidewall spacers, in accordance with certain embodiments of the present disclosure.

FIG. 5 illustrates the example cross-section of semiconductor device 100 after removing sidewall spacers 112, 114, 116, 118, in accordance with certain embodiments of the present disclosure. At this step in the process, semiconductor device 100 may only include select gates 104, 106 atop substrate 102 (and separated from substrate 102 via gate dielectric materials 108, 110), having source region 124 formed within an active region of substrate 102 between select gates 104, 106.

Figure 6:
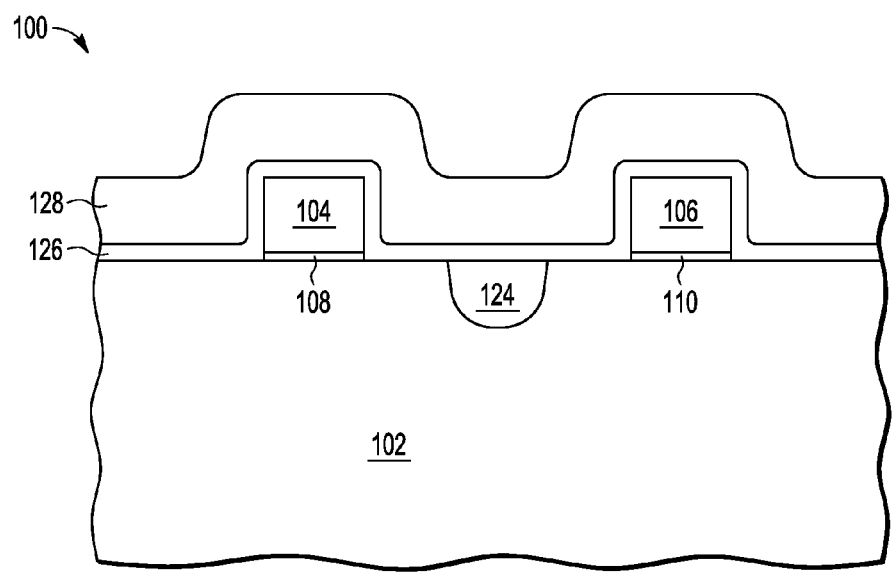
FIG. 6 illustrates the example cross-section of the semiconductor device after depositing a charge storage layer and a control gate material over portions of the semiconductor device, in accordance with certain embodiments of the present disclosure.

FIG. 6 illustrates the example cross-section of semiconductor device 100 after depositing charge storage layer 126 and control gate material 128 over portions of semiconductor device 100, in accordance with certain embodiments of the present disclosure. In some embodiments, charge storage layer 126 may include a plurality of layers. For example, in configurations employing nanocrystals as isolated charge storage elements, charge storage layer 126 may include a bottom oxide layer, a plurality of nanocrystals, and a top oxide layer. Control gate material 128 may be any appropriate material used to form a merged control gate associated with select gates 104, 106. For example, control gate material 128 may be a relatively deep layer of polysilicon deposited over charge storage layer 126.

Figure 7:
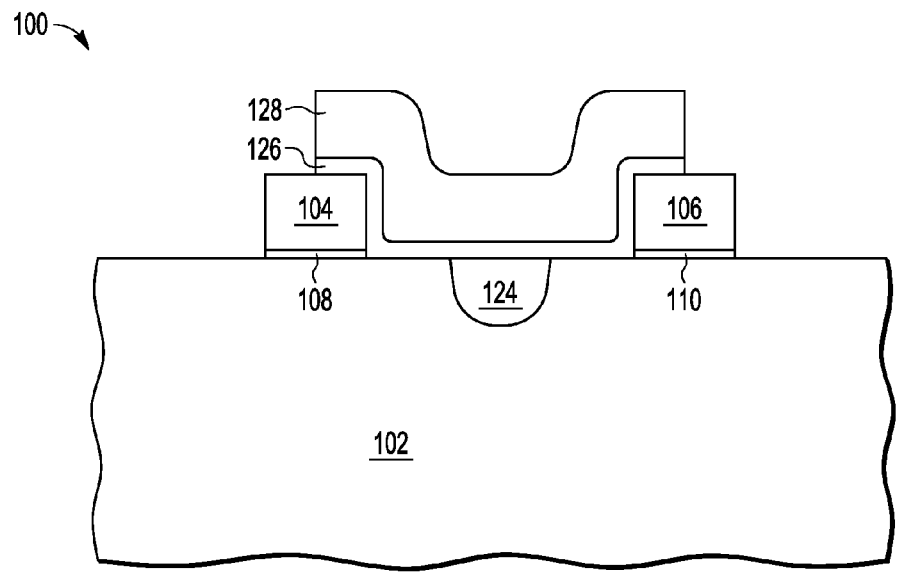
FIG. 7 illustrates the example cross-section of the semiconductor device after patterning portions of the charge storage layer and control gate material, in accordance with certain embodiments of the present disclosure.

FIG. 7 illustrates the example cross-section of semiconductor device 100 after patterning portions of charge storage layer 126 and control gate material 128, in accordance with certain embodiments of the present disclosure. Charge storage layer 126 and control gate material 128 may be removed over portions of semiconductor device 100 such that control gate material 128 remains as the top layer (e.g., the control gate) only over portions of select gates 104, 106, source region 124, and the portion of charge storage layer 126 covering the same portions of select gates 104, 106, source region 124, and intervening portions of substrate 102. In this way, a merged control gate may be formed for a plurality of bitcells of a memory array.

Figure 8:
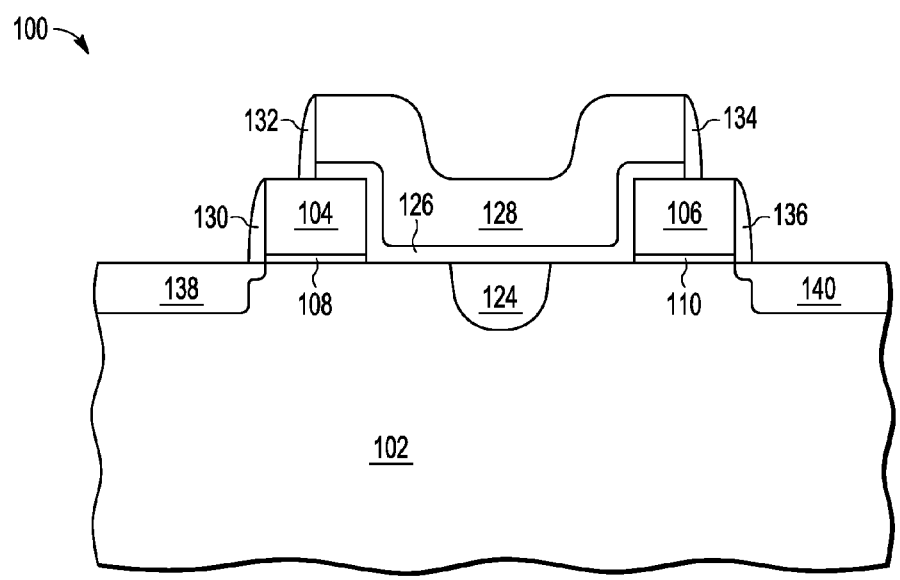
FIG. 8 illustrates the example cross-section of the semiconductor device after forming a plurality of drain regions having portions thereof aligned via the select gates and sidewall spacers, in accordance with certain embodiments of the present disclosure.

FIG. 8 illustrates the example cross-section of semiconductor device 100 after forming a plurality of drain regions 138, 140 having portions thereof aligned via select gates 104, 106 and sidewall spacers 130, 136, in accordance with certain embodiments of the present disclosure. In some embodiments, semiconductor device 100 may also include one or more sidewall spacers 132, 134 over end portions of charge storage layer 126 and/or control gate material 128. Drain regions 138, 140 may be any appropriately doped region(s) of substrate 102 doped via any appropriate doping process (e.g., in-situ doping) with an appropriate doping type (e.g., N-type, P-type). Drain regions 138, 140 are formed in an active region of substrate 102 that has a particular doping of a concentration that is selected for the bitcells in the memory array.

Figure 9:
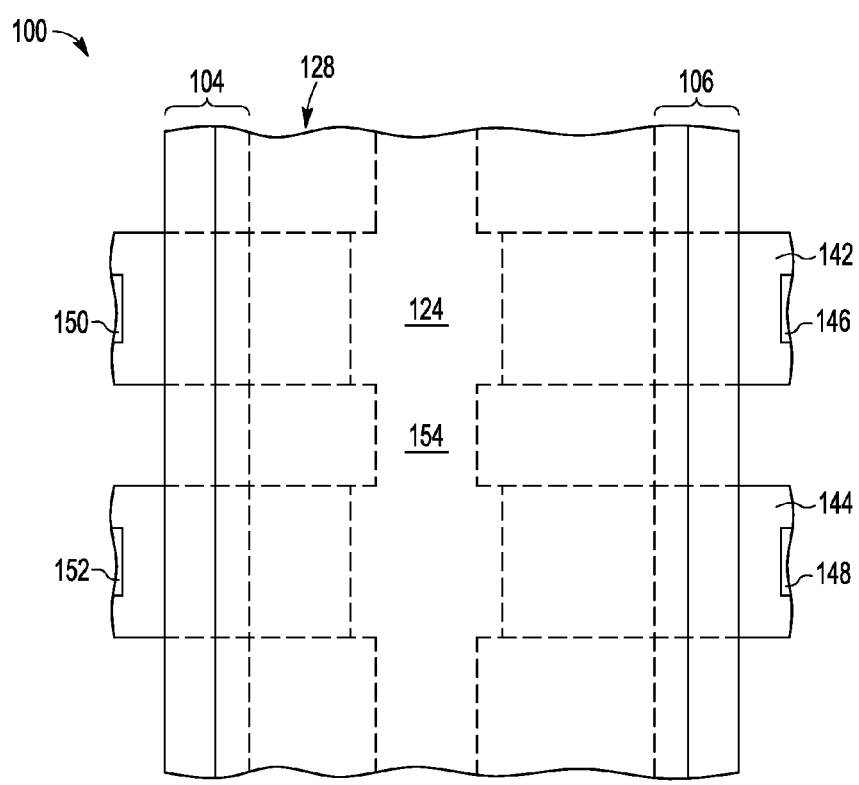
FIG. 9 illustrates an example semiconductor device for forming merged control gate structures, in accordance with certain embodiments of the present disclosure.

FIG. 9 illustrates example semiconductor device 100 for forming merged control gate structures 128, in accordance with certain embodiments of the present disclosure. In some embodiments, semiconductor device 100 may include select gates 104, 106; merged control gate 128, bit lines 142, 144; and bit line contacts 146, 148, 150, 152. As described in more detail above with reference to FIGS. 1-8, a memory cell (or bitcell) may include a buried source region (e.g., source region 124), a select gate (e.g., select gate 104), a control gate (e.g., merged control gate 128), and a bit line including a bit line contact (e.g., bit line 142 including bit line contact 150).

In such a manner, a memory array may be formed with multiple bitcells sharing a buried source and a merged control gate structure. For example, semiconductor device 100 may include a first memory cell (e.g., a memory cell having select gate 104) and a second memory cell (e.g., a memory cell having select gate 106) in and over substrate 102. Semiconductor device 100 may include a first active region in the substrate, a first doped region 124 in the first active region, wherein a top surface of the first active region is substantially coplanar with a top surface of the first doped region; a control gate 128 over the first doped region and extending past the first doped region over the first active region on a first side of the first doped region and extending past the first doped region over the first active region on a second side of the first doped region, wherein the first side is opposite the second side; a charge storage layer 126 between the first control gate and the first active region including between the first select gate and the first doped region; a first select gate 104 over the first active region on the first side of the first doped region and adjacent to the control gate; and a second select gate 106 over the first active region on the second side of the first doped region and adjacent to the control gate.

Depending on the configuration of the memory array, semiconductor device 100 may further include a second doped region (e.g., drain region 138) in the first active region, wherein the second doped region is adjacent to the first select gate; and a third doped region (e.g., drain region 140) in the first active region, wherein the third doped region is adjacent to the second select gate. In such a configuration, the second doped region may be a drain of the first memory cell, the third doped region may be a drain of the second memory cell, and the first doped region may be a source for the first memory cell and the second memory cell.

Further, semiconductor device 100 may include a third memory cell and a fourth memory cell, include a second active region connected to the first active region; and a fourth doped region, wherein the fourth doped region is in the second active region and is connected (e.g., via connection 154) to the first doped region. Control gate structure 128 may extend over the fourth doped region and extend past the fourth doped region over the second active region on a first side of the fourth doped region and extend past the fourth doped region over the second active region on a second side of the second doped region, wherein the first side of the second active region is opposite the second side of the second active region. Charge storage layer 126 may be between the first control gate and the second active region including between the first select gate and the fourth doped region; first select gate 104 may be over the second active region on the first side of the second doped region and adjacent to the control gate in the second active region; and second select gate 106 may be over the second active region on the second side of the second doped region and adjacent to the control gate in the second active region.

As described in more detail above with respect to FIGS. 1-8, semiconductor device 100 may be formed by a variety of methods, including: forming a first select gate 104 over substrate 102; forming a second select gate 106 over substrate 102; forming a first doped region (e.g., source region 124) in substrate 102 between first select gate 104 and second select gate 106, wherein a top surface of the first doped region is substantially coplanar with a top surface of substrate 102; forming a control gate (e.g., merged control gate structure 128) over the first doped region, between the first doped region and first select gate 104, and between the first doped region and second select gate 106. In addition, the method may include forming charge storage layer 126 over substrate 102 including over the first doped region prior to forming control gate 128. In some embodiments, the method may include forming a gate dielectric layer (e.g., dielectric layers 108, 110) on substrate 102 prior to forming select gates 104, 106.

In some embodiments, forming the first doped region may include forming a first sidewall spacer (e.g., sidewall spacer 114) on first select gate 104 on a side nearest second select gate 106; forming a second sidewall spacer (e.g., sidewall spacer 116) on second select gate 106 on a side nearest first select gate 104; implanting into substrate 102 using the first sidewall spacer and the second sidewall spacer as a mask to form the first doped region (e.g., source region 124). This may also include removing the first sidewall spacer and the second sidewall spacer to leave a first space adjacent to the first select gate and a second space adjacent to the second select gate. Forming the control gate in this manner may also include forming a conductive material in the first space, the second space, and over the first doped region. This may further include forming the control gate over a portion of first select gate 104 and a portion of second select gate 106.

In some embodiments, forming the first doped region (e.g., source region 124) may include forming a masking layer (e.g., photoresist layer 122) over substrate 102, wherein the masking layer has an opening over a region between the first select gate and the second select gate (e.g., opening 120); and performing an implant into the substrate through the opening to form the first doped region.

As mentioned above, other methods may be used to form semiconductor device 100. For example, the method may include forming a first select gate 104 and a second select gate 106 separated from first select gate 104 by a space; forming a doped region (e.g., source region 124) centered between first select gate 104 and second select gate 106 in the space, wherein the doped region has a top surface substantially coplanar with a top surface of substrate 102; forming a control gate (e.g., merged control gate structure 128) adjacent to first select gate 104 and second select gate 106 and over the first doped region. Such a method may further include forming the doped region by forming a first sidewall spacer (e.g., sidewall spacer 114) on first select gate 104 on a side nearest second select gate 106; forming a second sidewall spacer (e.g., sidewall spacer 116) on second select gate 106 on a side nearest first select gate 104; and implanting into substrate 102 using the first sidewall spacer and the second sidewall spacer as a mask to form the doped region (e.g., source region 124).

By now it should be appreciated that there has been provided systems and methods for split-gate memory cell scaling with merged control gates. By burying a shared source region and merging a control gate structure, the memory cell array may be scaled further in accordance with advancing manufacturing processes.

Although the invention is described herein with reference to specific embodiments, various modifications and changes can be made without departing from the scope of the present invention as set forth in the claims below. For example, the source region may be buried throughout an active region associated with a wordline and/or only in certain portions of the active region. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a memory device using a substrate, comprising:
    forming a first select gate over the substrate;
    forming a second select gate over the substrate;
    forming a first doped region in the substrate between the first select gate and the second select gate, wherein a top surface of the first doped region is substantially coplanar with a top surface of the substrate;
    forming a control gate over the first doped region, between the first doped region and the first select gate, and between the first doped region and the second select gate; and
    forming a charge storage layer over the substrate including over the first doped region prior to forming the control gate.

2. The method of claim 1, wherein the charge storage layer comprises nanocrystals.

3. The method of claim 1, wherein the forming the first doped region comprises:
    forming a first sidewall spacer on the first select gate on a side nearest the second select gate;
    forming a second sidewall spacer on the second select gate on a side nearest the first select gate;
    implanting into the substrate using the first sidewall spacer and the second sidewall spacer as a mask to form the first doped region.

4. The method of claim 3, further comprising removing the first sidewall spacer and the second sidewall spacer to leave a first space adjacent to the first select gate and a second space adjacent to the second select gate.

5. The method of claim 4, wherein the forming the control gate comprises forming a conductive material in the first space, the second space, and over the first doped region.

6. The method of claim 5, wherein the forming the control gate further comprises forming the control gate over a portion of the first select gate and a portion of the second select gate.

7. The method of claim 6, wherein the forming the charge storage layer comprises forming a layer comprising nanocrystals over the substrate prior to forming the control gate.

8. The method of claim 1, further comprising forming a gate dielectric on the substrate prior to forming the first select gate and the second select gate.

9. The method of claim 1, wherein the forming the first doped region comprises:

forming a masking layer over the substrate, wherein the masking layer has an opening over a region between the first select gate and the second select gate; and performing an implant into the substrate through the opening to form the first doped region.

10. A method of forming a memory device using a substrate, comprising:

forming a first select gate and a second select gate separated from the first select gate structure by a space;

forming a doped region centered between the first select gate and the second select gate in the space, wherein the doped region has a top surface substantially coplanar with a top surface of the substrate;

forming a control gate adjacent to the first select gate and the second select gate and over the doped region; and forming a charge storage layer over the substrate including over the doped region prior to forming the control gate.

11. The method of claim 10, wherein the forming the doped region comprises:

forming a first sidewall spacer on the first select gate on a side nearest the second select gate;

forming a second sidewall spacer on the second select gate on a side nearest the first select gate;

implanting into the substrate using the first sidewall spacer and the second sidewall spacer as a mask to form the doped region.

* * * * *